(12) United States Patent
Nalla et al.

(10) Patent No.: US 9,029,258 B2
(45) Date of Patent: May 12, 2015

(54) THROUGH SILICON VIA METALLIZATION

(71) Applicant: Lam Research Corporation, Fremont, CA (US)

(72) Inventors: Praveen Reddy Nalla, Fremont, CA (US); Novy Sastrawati Tjokro, San Ramon, CA (US); Artur Kolics, Dublin, CA (US); Seshasayee Varadarajan, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 10 days.

(21) Appl. No.: 13/759,938

(22) Filed: Feb. 5, 2013

(65) Prior Publication Data

US 2014/0217590 A1 Aug. 7, 2014

(51) Int. Cl.
*H01L 23/538* (2006.01)
*H01L 23/532* (2006.01)
*H01L 21/02* (2006.01)
*H01L 23/48* (2006.01)

(52) U.S. Cl.
CPC .... *H01L 23/53238* (2013.01); *H01L 21/02697* (2013.01); *H01L 23/481* (2013.01); *H01L 2924/0002* (2013.01)

(58) Field of Classification Search
CPC .......... H01L 21/76843; H01L 21/76846; H01L 21/76877
USPC .......................................... 257/751; 438/653
See application file for complete search history.

(56) References Cited

U.S. PATENT DOCUMENTS

| | | | |
|---|---|---|---|
| 6,010,960 A * | 1/2000 | Nogami | 438/653 |
| 6,268,291 B1 * | 7/2001 | Andricacos et al. | 438/694 |
| 6,734,560 B2 * | 5/2004 | Catabay et al. | 257/751 |
| 2008/0012133 A1 * | 1/2008 | Shih et al. | 257/751 |
| 2008/0254232 A1 * | 10/2008 | Gordon et al. | 427/585 |
| 2010/0230818 A1 * | 9/2010 | Birner et al. | 257/751 |
| 2011/0147938 A1 * | 6/2011 | Kang | 257/751 |
| 2011/0221044 A1 | 9/2011 | Danek et al. | |
| 2013/0270702 A1 * | 10/2013 | Yu et al. | 257/751 |

* cited by examiner

*Primary Examiner* — S. V. Clark
*Assistant Examiner* — Monica D Harrison
(74) *Attorney, Agent, or Firm* — Beyer Law Group LLP

(57) ABSTRACT

To achieve the foregoing and in accordance with the purpose of the present invention, a method for filling through silicon vias is provided. A dielectric layer is formed over the through silicon vias. A barrier layer, comprising tungsten, is deposited by CVD or ALD over the dielectric layer. The through silicon vias are filled with a conductive material.

34 Claims, 5 Drawing Sheets

US 9,029,258 B2

THROUGH SILICON VIA METALLIZATION

BACKGROUND OF THE INVENTION

Field of the Invention

The invention relates to a method of forming semiconductor devices on a semiconductor wafer. More specifically, the invention relates to forming through via metallization.

Silicon semiconductors containing through silicon (Si) vias are used in a variety of technologies, from imaging products and memory to high-speed logic and high voltage device products. One technology that relies heavily on vias formed through silicon semiconductor wafers (TSVs) is a three dimensional (3D) integrated circuit (IC). 3D ICs are created by stacking thinned semiconductor wafer chips and interconnecting them with through-silicon vias (TSVs).

SUMMARY OF THE INVENTION

To achieve the foregoing and in accordance with the purpose of the present invention, a method for filling through silicon vias is provided. A dielectric layer is formed over the through silicon vias. A barrier layer, comprising tungsten, is deposited by CVD or ALD over the dielectric layer. The through silicon vias are filled with a conductive material.

In another manifestation of the invention semiconductor structure with conductive fillings in through silicon vias formed by a method is provided. A dielectric layer is deposited over the through silicon vias. A tungsten containing barrier layer by CVD or ALD is deposited over the dielectric layer. The through silicon vias are filed with a conductive material.

In another manifestation of the invention, a semiconductor structure is provided. A silicon substrate is provided with through silicon vias features etched into the silicon substrate. A dielectric layer is over the through silicon via features. A barrier layer comprising tungsten is over the dielectric layer;. A conductive filling is within the via features.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
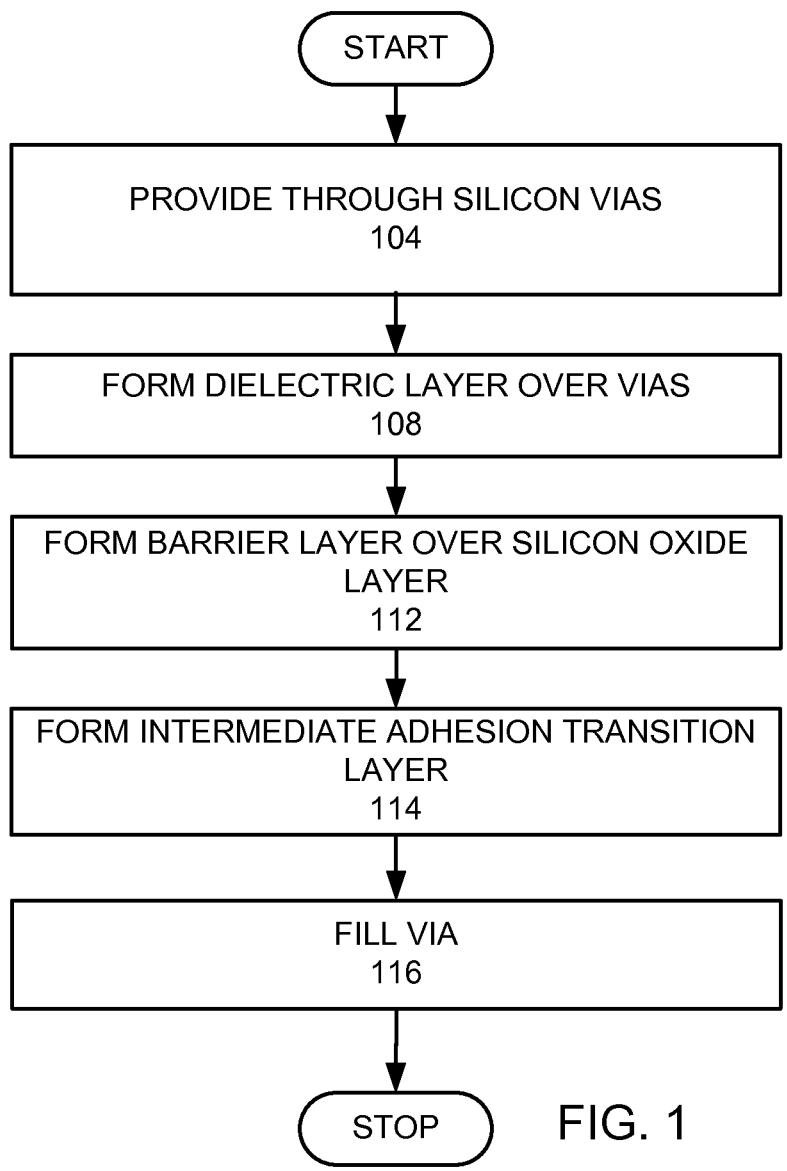
FIG. 1 is a flow chart of an embodiment of the invention.

FIG. 1 is a high level flow chart of an embodiment of the invention. Through silicon vias are provided (step 104). A dielectric (most often silicon oxide or silicon oxide based) layer is formed over the through silicon vias (step 108). A barrier layer is formed over the dielectric layer (step 112). An intermediate adhesion transition layer is formed over the barrier layer (step 114). The through silicon vias are filled (step 116).

Figure 2A:
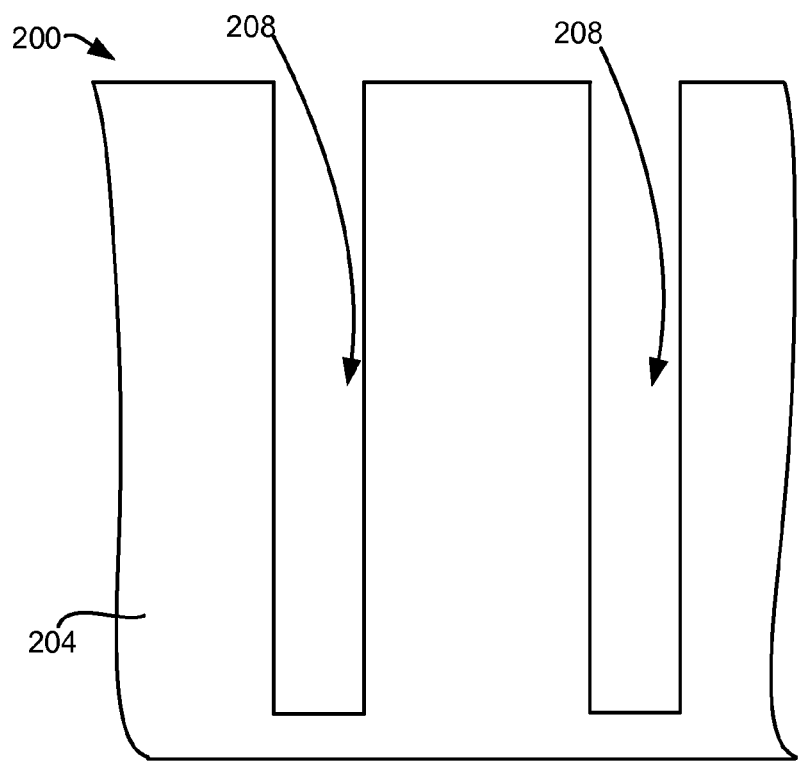
FIGS. 2A-E are schematic views of the formation of structures using the inventive process.

In a preferred embodiment of the invention, through silicon vias in a substrate are provided (step 104). FIG. 2A is a schematic cross-sectional view of a stack 200 with a substrate 204 with through silicon vias 208. The through silicon vias 208 may pass entirely through the silicon substrate 204 or partially through the silicon substrate 204. Normally, if the through silicon vias do not pass entirely through the silicon substrate 204, a subsequent process is provided to remove the parts of the silicon substrate through which the through silicon vias 208 do not pass, so that the through silicon vias 208 pass through the remaining substrate. Preferably, the through silicon vias have a width less than 15 μm. More preferably, the through silicon vias have an aspect ratio greater than 8:1. Preferably, the through silicon vias have a depth greater than 20 μm.

Figure 2B:
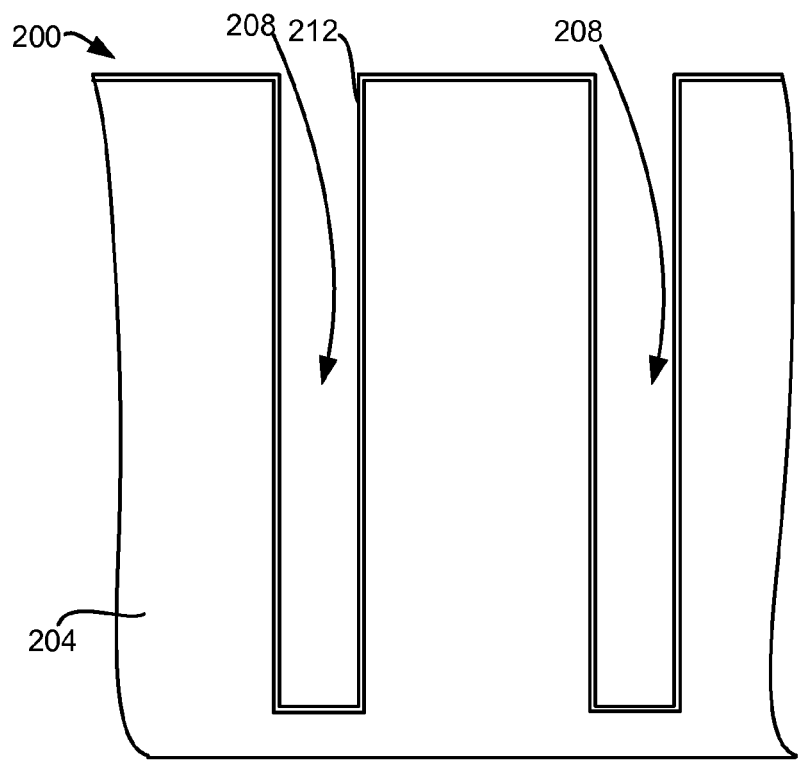

A dielectric layer is formed over the through silicon vias (step 108). FIG. 2B is a schematic cross-sectional view of the stack 200 after a silicon oxide layer 212 is formed over the through silicon vias 208. Silicon oxide, the most commonly used dielectric, can be deposited by CVD or ALD processes or thermally grown from Si in an oxidizing atmosphere.

Figure 2C:
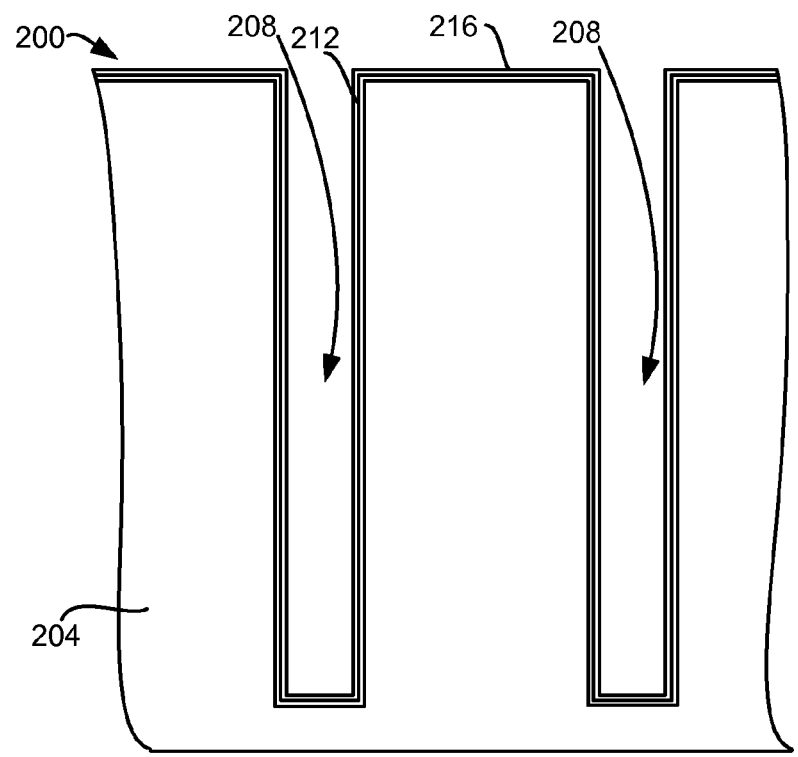

A barrier layer is formed over the silicon oxide layer (step 112). FIG. 2C is a schematic cross-sectional view of the stack 200 after the barrier layer 216 is formed over the silicon oxide layer 212. Preferably, the barrier layer comprises at least one of tungsten nitride, TiN, TiW, TiSN, WSiN, or RuTiN. More preferably, the barrier layer comprises >10% tungsten by weight. The barrier can also be deposited with PVD, CVD and ALD processes though the latter two are preferred due to the higher conformality of the layer they can provide and hence CVD and ALD provide plating even in very high aspect ratio vias (>17:1).

Figure 2D:
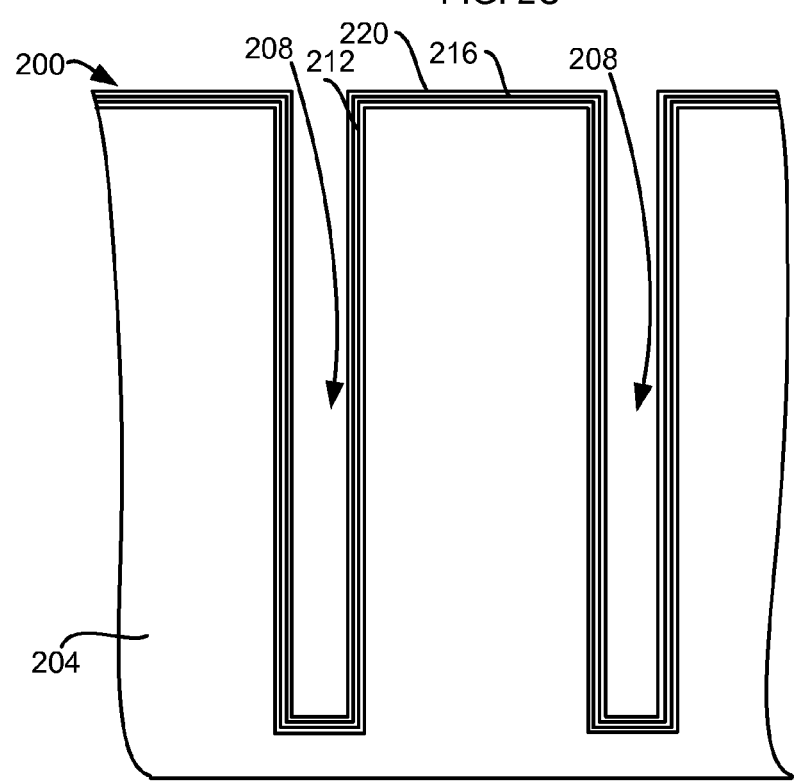

An intermediate adhesion transition layer is formed over the barrier layer (step 114). Preferably, the intermediate adhesion transition layer is formed by an electroless deposition (ELD), atomic layer deposition (ALD), or chemical vapor deposition (CVD) process. More preferably, the intermediate adhesion transition layer is made of nickel, cobalt, palladium or a combination of these or is an alloy of nickel, cobalt, or palladium. In this example, the intermediate adhesion transition layer is nickel or a nickel alloy, which as a thickness of 50 Å to 5000 Å and more preferably 100 Å to 500 Å. An example of a recipe for providing the intermediate adhesion transition layer using ELD is cleaning the tungsten nitride (WN, where tungsten nitride is a material of tungsten and nitrogen, where the ratio of tungsten to nitrogen may be one of many different ratios) surface (if needed), deionized water (DI) rinsing the surface, applying activation solution to the surface to make the surface catalytically active, rinse the activated surface with DI water, acid or complexing agent containing solution, further rinsing the surface with DI water (if non-DI rinse was used after activation), electroless plating Ni or Ni alloy on the activated surface. The recipe may contain optional spin-off and/or drying step after each process step. FIG. 2D is a schematic cross-sectional view of the stack 200 after the intermediate adhesion transition layer 220 is formed over the barrier layer 216. In other embodiments the intermediate adhesion transition layer may be tungsten silicide ($WSi_x$ where x=1 or 2) and tungsten titanium ($WTi_x$).

Figure 2E:
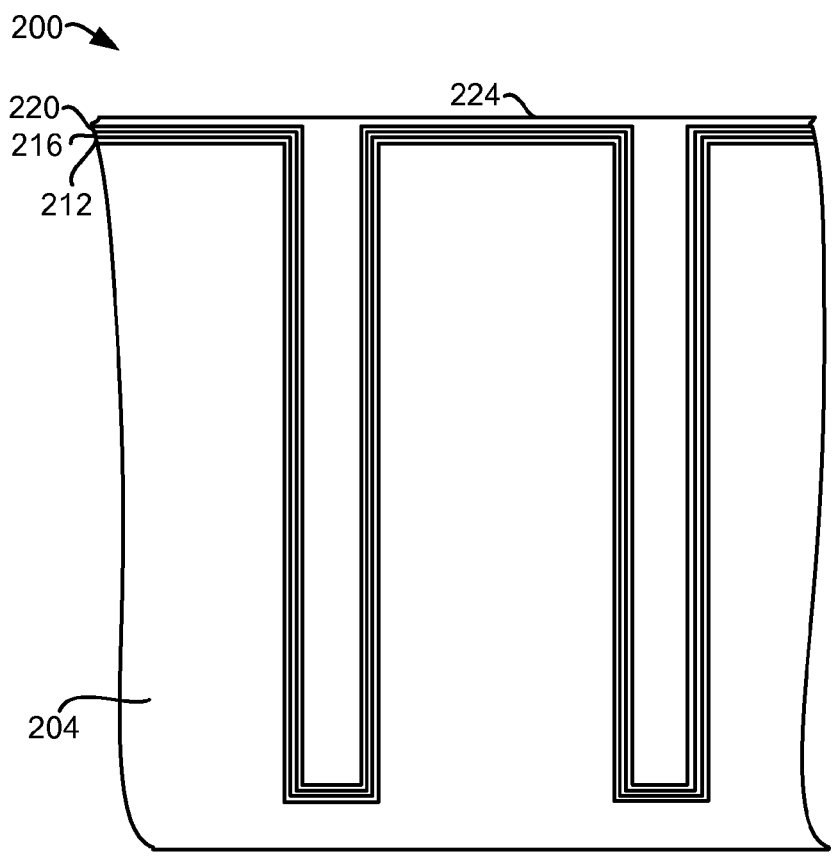
Figure 3:
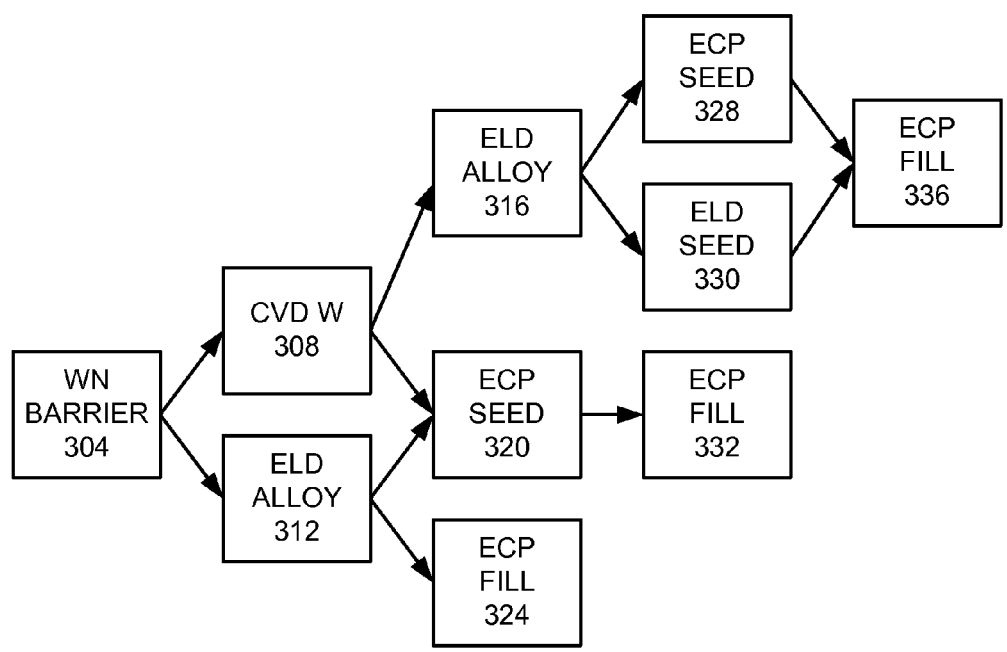
FIG. 3 is a flow chart illustrating different embodiments of the invention.

FIG. 3 is a chart of different methods of metalizing the through silicon vias. In this embodiment, after a tungsten nitride barrier is formed (step 304) an alloy seed layer is deposited by an ELD process (step 312). The ELD solution has a pH between 4.0 and 12.5 and more preferably between 7.5 and 10.5. The deposition is done at temperature between room temperature to 95° C. and more preferably between 65° C. to 85° C. The solution contains at least one or more metal compounds (such as but not limited to chloride or sulfate salts of the metal(s)), pH adjustor(s) which may also function as a complexing agent, additional complexing agent if needed, and one or more reducing agents. The electroless plating solution can also contain other additives such as surfactants, stabilizers, stress reducers, etc. An electroplating copper process (ECP) is used to fill the through silicon vias (step 324). The electroplating copper or copper alloy solution used for filling is acidic and operates at temperatures between 15° C. to 90° C., and more preferably between 20° C. and 45° C. The solution contains at least one or more metal compounds (such as but not limited to chloride or sulfate salts of the metal(s)), pH adjustor(s) and the necessary additives from the group of suppressors, accelerators and levelers that provides bottom up fill. FIG. 2E is a schematic cross-sectional view of the stack 200 after the through silicon vias are filled with a copper or copper alloy 224 using an ECP process. In this embodiment, the copper or copper alloy 224 outside the through silicon vias 208 has a thickness of less than 200 Å. A planarization process may be used to planarize the stack 200 to remove the copper or copper alloy 224, the seed layer 220, barrier layer 216, and silicon oxide layer 212 above the through silicon vias 208.

As shown in FIG. 3, other processes may be used for metalizing the through silicon vias, after forming the tungsten nitride barrier layer (step 304). For example, a tungsten seed layer may be formed using a CVD process (step 308), followed by either an ELD metal or metal alloy layer (step 316) or an electroplating copper or copper alloy process (ECP) seed deposition (step 320). The ELD of a metal or metal alloy layer (step 316) would be followed by an electroplating copper or copper alloy seed deposition (step 328), which would be followed by an electroplating copper or copper alloy via fill (step 336). In the alternative the ELD of the metal or metal alloy layer (step 316) may be followed by an ELD seed layer deposition (step 330), which is then followed by an electroplating copper or copper alloy via fill (step 336). The ECP seed deposition (step 320) would be followed by an electroplating copper fill (step 332). In another embodiment, the ELD of a Ni alloy (step 312) may be followed by the ECP seed deposition of copper or copper alloy seed (step 320) followed by an electroplating copper or copper alloy fill (step 332).

The use of a tungsten nitride barrier layer provides a lower cost barrier layer on which direct metal deposition may be performed with good adhesion. In this example, the pure nickel or nickel alloy seed layer may be directly deposited in the WN barrier layer.

Silicon and silicon oxide have a coefficient of thermal expansion of about 4 ppm/° C. and less than 1 ppm/° C., respectively. Copper has a coefficient of thermal expansion of about 17 ppm/° C. Tungsten and tungsten nitride have a thermal expansion coefficients of about 4.5 ppm/° C. and 5.8 ppm/° C., respectively. Nickel and Ni alloys have a thermal expansion coefficient of 10-13 ppm/° C. Providing adjacent layers of materials with large differences between coefficients of thermal expansion increases stress between the layers as the temperature of the layers changes. By providing an ELD Ni or Ni alloy seed layer 220 between the barrier and the copper fill 224, stress created by thermal expansion is reduced. In addition, nickel has good adhesion to tungsten, tungsten nitride, and copper.

In other embodiments, the barrier layer comprises a combination of one or more of W, Ti, Ta, N, Si, O, or C. In other embodiments, the intermediate adhesion transition layer comprises a combination of one or more of W, Co, Ru, Ni, Pd, or any transition metal/metal alloys with reducible oxide (cobalt, ruthenium, etc.), catalytic activity (cobalt, ruthenium, palladium, etc.), or low resistivity (<20 micro Ohms cm).

Embodiments of the invention allow for the filling of through silicon vias at a reduced cost. More specifically, some embodiments of the invention may provide a cost reduction of more than 50% over conventional TSV metallization processes. In addition, various embodiments can provide a uniform barrier layer, even where aspect ratios of the TSV are 20:1 or higher.

By replacing conventional PVD barrier/seed metallization processes with ALD and/or CVD and/or ELD and ECP processes costs may be reduced while being able to provide processes for through silicon vias of smaller diameters and higher aspect ratios. This is because CVD and ELD processes are more conformal and less sensitive to aspect ratio. Embodiments of the invention also lower planarization, such as chemical mechanical polishing (CMP), costs by reducing field thicknesses to less than 1 μm.

In another embodiment, a first intermediate adhesion transition layer of Ni, Co, or Pd is formed using an electroless process. A second intermediate adhesion transition layer is then formed comprising copper using an electroless process.

Other embodiments of the invention may provide additional liner, barrier or seed layers. Embodiments may use an ELD barrier layer of a Co or Ni alloy, where the alloying elements preferably comprise Co, Ni, Fe, W, Mo, P, B, Re, Mn, Cr, Ge, Sn, In, Ga, or Cu. Embodiments of the invention use an electroless liner or seed layer comprising a Co, Ni, or Cu alloy, where the alloying elements preferably comprise Co, Ni, Fe, W, Mo, P, B, Re, Mn, Cr, Ge, Sn, In, or Ga. In other embodiments, the electroplating seed can be metals or metal alloys that have low solubility in conventional acidic electroplating solutions used for filling TSV structures. For example, the seed can be Cu or Cu alloy, but is not restricted to CuNi, CuCo, CuMn, CuSn, and CuAg, but may be other metal alloy combinations, such as Ni, NiCo, Pd, Ru, etc. This allows the electroplated layer to be nearly the same as the electroplated seed.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:
1. A method for filling through silicon vias, comprising:
depositing a dielectric layer over the through silicon vias;
depositing a tungsten containing barrier layer by CVD or ALD over the dielectric layer; and
filling the through silicon vias with a conductive material, wherein the barrier layer is tungsten nitride and wherein the filling the through silicon vias, comprises:

using electroless deposition to deposit a nickel or nickel alloy seed layer over the tungsten nitride barrier layer; and using electroplating to fill the through silicon vias with a copper or copper alloy.

2. The method, as recited in claim 1, further comprising CVD, ELD, ECP or ALD of nickel, cobalt, palladium, or alloys, containing one or more of these elements, forming an intermediate adhesion transition over the barrier layer.

3. The method, as recited in claim 2, wherein the dielectric layer is a silicon oxide based material.

4. The method, as recited in claim 1, further comprising planarizing parts of the conductive material, barrier layer, and a seed layer.

5. The method, as recited in claim 1, wherein the filling the through silicon vias further comprises:
using electroplating to deposit a seed layer over the nickel or nickel alloy layer.

6. The method, as recited in claim 1, wherein the filling the through silicon vias further comprises:
using CVD or ALD to deposit a tungsten or other tungsten containing layer such as tungsten silicide or tungsten titanium layer over the tungsten nitride barrier layer.

7. The method, as recited in claim 1, wherein the barrier layer is tungsten nitride and wherein the filling the through silicon vias, comprises:
using CVD or ALD to deposit a tungsten layer over the tungsten nitride barrier layer; and
using electroplating to deposit a seed layer over the ELD layer.

8. The method, as recited in claim 1, wherein the through silicon vias have a depth of at least 20 μm.

9. The method, as recited in claim 1, wherein the dielectric layer is a silicon oxide based material.

10. The method, as recited in claim 1, further comprising planarizing parts of the conductive material, barrier layer, and a seed layer.

11. The method, as recited in claim 1, further comprising CVD, ELD, ECP or ALD of nickel or nickel alloy of these forming an intermediate adhesion transition over the barrier layer.

12. The method, as recited in claim 1, further comprising: CVD, ELD, ECP or ALD of nickel, cobalt, palladium, or alloys containing one or more of these elements forming an intermediate adhesion transition over the barrier layer, wherein the filling the through silicon vias uses an electrolytic copper plating process.

13. The method, as recited in claim 1, further comprising:
forming a first intermediate adhesion transition layer of Ni, Co, or Pd, or alloys, containing one or more of these elements by CVD, ELD or ALD over the barrier layer; and
forming a second intermediate adhesion transition layer of Cu or Cu alloys by CVD, ELD, or ALD over the first intermediate adhesion transition layer.

14. A semiconductor structure with conductive fillings in through silicon vias formed by a method, comprising:
depositing a dielectric layer over the through silicon vias;
depositing a tungsten containing barrier layer by CVD or ALD over the dielectric layer; and
filling the through silicon vias with a conductive material, wherein the method further comprises CVD, ELD, ECP or ALD of nickel or nickel alloy over the barrier layer.

15. The semiconductor structure, as recited in claim 14, further comprising CVD, ELD, ECP or ALD of nickel, cobalt, palladium or combination or alloy of these forming an intermediate adhesion transition over the barrier layer.

16. The semiconductor structure, as recited in claim 15, wherein the filling the through silicon vias uses an electrolytic copper plating process.

17. The semiconductor structure, as recited in claim 14, wherein the filling the through silicon vias uses an electroless deposition process.

18. The semiconductor structure, as recited in claim 17, wherein the barrier layer is tungsten nitride.

19. The semiconductor structure, as recited in claim 18, wherein the dielectric layer is a silicon oxide based material.

20. The semiconductor structure, as recited in claim 19, wherein the conductive material is a copper or copper alloy.

21. The semiconductor structure, as recited in claim 20, wherein the method further comprises planarizing parts of the conductive material, barrier layer, and a seed layer.

22. The semiconductor structure, as recited in claim 14, wherein the filling the through silicon vias, comprises using electroplating to fill the through silicon vias with a copper or copper alloy.

23. The semiconductor structure, as recited in claim 14, wherein the filling the through silicon vias uses an electroless deposition process.

24. The semiconductor structure, as recited in claim 14, wherein the barrier layer is tungsten nitride.

25. The semiconductor structure, as recited in claim 14, wherein the conductive material is a copper or copper alloy.

26. The semiconductor structure, as recited in claim 14, wherein the wherein the through silicon vias have a depth of at least 20 μm.

27. The semiconductor structure, as recited in claim 14, wherein the dielectric layer is a silicon oxide based material.

28. The semiconductor structure, as recited in claim 14, wherein the method further comprises planarizing parts of the conductive material, barrier layer, and a seed layer.

29. A semiconductor structure, comprising:
a silicon substrate with through silicon vias features etched into the silicon substrate;
a dielectric layer over the through silicon via features;
a barrier layer comprising tungsten over the dielectric layer;
a conductive filling within the via features; and
a nickel or nickel alloy layer between the barrier layer and the conductive filling.

30. The semiconductor structure, as recited in claim 29, wherein the barrier layer is tungsten nitride.

31. The semiconductor structure, as recited in claim 30, wherein the dielectric layer is silicon oxide based.

32. The semiconductor structure, as recited in claim 31, wherein the conductive filling is copper or copper alloy.

33. The semiconductor structure, as recited in claim 32, wherein the wherein the through silicon vias have a depth of at least 20 μm.

34. The semiconductor structure, as recited in claim 29, further comprising an intermediate adhesion transition layer comprising nickel, cobalt, palladium, or a combination or alloy thereof between the barrier layer and the conductive filling.

* * * * *